United States Patent
Bai et al.

(10) Patent No.: US 9,324,637 B1
(45) Date of Patent: Apr. 26, 2016

(54) QUAD FLAT NON-LEADED SEMICONDUCTOR PACKAGE WITH WETTABLE FLANK

(71) Applicant: FREESCALE SEMICONDUCTOR, INC., Austin, TX (US)

(72) Inventors: Zhigang Bai, Tiianjin (CN); Xingshou Pang, Tianjin (CN); Nan Xu, Tianjin (CN); Jinzhong Yao, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/743,986

(22) Filed: Jun. 18, 2015

(30) Foreign Application Priority Data

Dec. 17, 2014 (CN) .......................... 2014 1 0858226

(51) Int. Cl.
| | |
|---|---|
| *H01L 21/00* | (2006.01) |
| *H01L 23/495* | (2006.01) |
| *H01L 23/31* | (2006.01) |
| *H01L 23/00* | (2006.01) |
| *H01L 21/78* | (2006.01) |
| *H01L 21/48* | (2006.01) |
| *H01L 21/288* | (2006.01) |

(52) U.S. Cl.
CPC ...... *H01L 23/49503* (2013.01); *H01L 21/2885* (2013.01); *H01L 21/4821* (2013.01); *H01L 21/78* (2013.01); *H01L 23/3107* (2013.01); *H01L 23/49541* (2013.01); *H01L 23/49582* (2013.01); *H01L 24/32* (2013.01); *H01L 24/49* (2013.01); *H01L 24/73* (2013.01); *H01L 2224/27462* (2013.01); *H01L 2224/29611* (2013.01); *H01L 2224/32245* (2013.01); *H01L 2224/48247* (2013.01); *H01L 2224/73265* (2013.01); *H01L 2924/0105* (2013.01); *H01L 2924/01046* (2013.01); *H01L 2924/17717* (2013.01); *H01L 2924/17763* (2013.01)

(58) Field of Classification Search
CPC ..................... H01L 21/4821; H01L 23/49582; H01L 23/49541; H01L 23/49586; H01L 21/2885; H01L 24/49; H01L 24/29; H01L 24/30; H01L 21/78; H01L 23/32121; H01L 23/3107

See application file for complete search history.

(56) References Cited

U.S. PATENT DOCUMENTS

| | | |
|---|---|---|
| 6,238,952 B1 | 5/2001 | Lin |
| 6,261,864 B1 | 7/2001 | Jung et al. |
| 6,306,685 B1 | 10/2001 | Liu et al. |
| 6,333,252 B1 | 12/2001 | Jung et al. |
| 6,342,730 B1 | 1/2002 | Jung et al. |
| 6,495,909 B2 | 12/2002 | Jung et al. |
| 6,528,893 B2 | 3/2003 | Jung et al. |
| 6,608,366 B1 | 8/2003 | Fogelson et al. |
| 6,700,188 B2 | 3/2004 | Lin |
| 6,861,295 B2 | 3/2005 | Jung et al. |

(Continued)

*Primary Examiner* — Thanh Y Tran
(74) *Attorney, Agent, or Firm* — Charles E. Bergere

(57) ABSTRACT

A Quad Flat Non-leaded (QFN) semiconductor package has a semiconductor die mounted on a die flag of a lead frame. A molded housing with a base and sides covers the die. The package has electrically conductive mounting feet each of which includes an exposed base surface in the base of the housing, an opposite parallel surface covered by the housing, and an exposed end surface in the one of the sides of the housing. The exposed end surface is normal to, and located between, the exposed base surface and the opposite parallel surface. Bond wires selectively electrically connect electrodes of the die to respective ones of the mounting feet. An electrically conductive plating coats the exposed base portion and exposed end surface of the mounting feet.

14 Claims, 6 Drawing Sheets

(56) References Cited

U.S. PATENT DOCUMENTS

| | | |
|---|---|---|
| 7,023,074 B2 | 4/2006 | Li et al. |
| 7,033,866 B2 | 4/2006 | Chow et al. |
| 7,105,383 B2 | 9/2006 | Vo et al. |
| 7,348,269 B2 | 3/2008 | Tanaka et al. |
| 7,382,045 B2 | 6/2008 | Osako et al. |
| 7,397,112 B2 | 7/2008 | Sato et al. |
| 7,402,459 B2 | 7/2008 | Xiaochun et al. |
| 7,405,104 B2 | 7/2008 | Minamio et al. |
| 7,405,106 B2 | 7/2008 | Maloney et al. |
| 7,405,945 B2 | 7/2008 | Miura |
| 7,413,934 B2 | 8/2008 | Tellkamp |
| 7,423,337 B1 | 9/2008 | Patwardhan et al. |
| 7,456,049 B2 | 11/2008 | Miyata |
| 7,458,054 B2 | 11/2008 | Hara |
| 7,462,870 B2 | 12/2008 | Nakashima |
| 8,685,795 B2 | 4/2014 | Wang et al. |
| 2005/0029638 A1 | 2/2005 | Ahn |
| 2005/0116321 A1 | 6/2005 | Li et al. |
| 2005/0139982 A1* | 6/2005 | Fukaya ............... H01L 21/565 257/690 |
| 2007/0126092 A1 | 6/2007 | San Antonio |
| 2008/0268578 A1 | 10/2008 | Shimanuki et al. |
| 2011/0244629 A1 | 10/2011 | Gong |
| 2012/0032352 A1 | 2/2012 | Huening |
| 2015/0076690 A1* | 3/2015 | Yoshino ............ H01L 23/49541 257/737 |

* cited by examiner

QUAD FLAT NON-LEADED SEMICONDUCTOR PACKAGE WITH WETTABLE FLANK

BACKGROUND OF THE INVENTION

The present invention relates generally to semiconductor packaging, and, more specifically, to a Quad Flat Non-leaded (QFN) package with a wettable flank.

Semiconductor integrated circuits are continually decreasing in size and there is a corresponding demand for smaller yet denser circuits. At the same time, there is a desire for such circuits to provide the same or more inputs and outputs. Some types of semiconductor packages have a housing from which leads or lead fingers protrude. The lead fingers are used to interconnect the semiconductor package to external circuitry. Such packages may have a large footprint and the lead fingers increase package height.

As an alternative to packages with protruding lead fingers, a Quad Flat Non-leaded (QFN) package has been developed, which includes exposed contact pads or terminals underneath and on four sides of a rectangular semiconductor package formed with a semiconductor die mounted to a lead frame. The lead frame is formed from a sheet of metal that comprises a die attach pad often called a flag and arms (tie bars) that attach the flag to a frame. Down-set leads of the lead frame are electrically connected to electrodes of the die with bond wires. After wire bonding, the semiconductor die and pads are encapsulated in a plastic compound (material) leaving only underside sections of the leads exposed. The encapsulated semiconductor die and pads form a partially completed package integral with the sheet. The partially completed package is then cut (often referred to as a singulation process) from the sheet to form a rectangular package, where the underside sections of the leads provide contact pads adjacent the four sides of the package.

The lead frame typically comprises copper that is pre-plated with a material like Palladium, which prevents the copper from oxidizing. However, when the devices are singulated, the sides of the sides of the leads are cut, which removes the Palladium pre-plating. This leaves the ends of the leads subject to oxidation. It also makes them more difficult to solder when mounting the device to a printed circuit board. It would be advantageous to have a QFN package that allows for improved quality of the solder joint connections.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
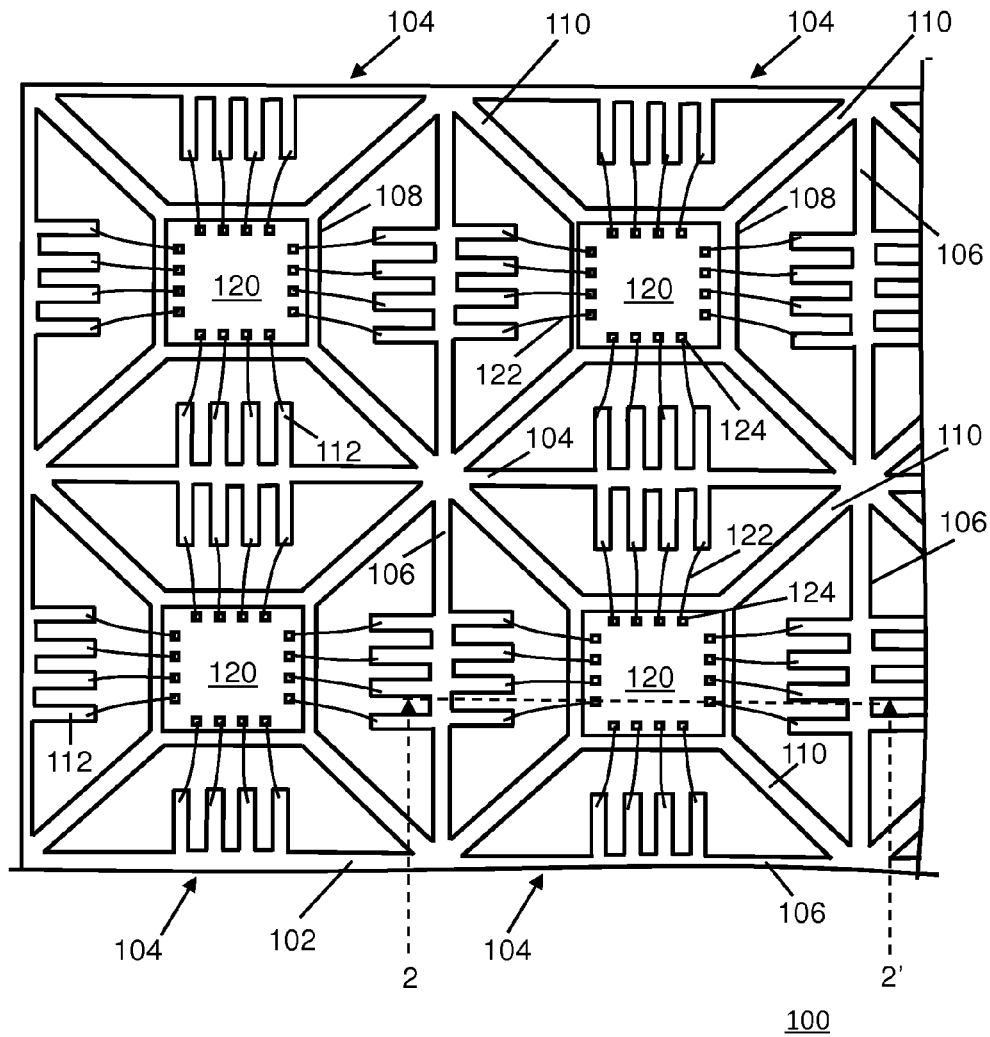
FIG. 1 is a top plan view of a populated lead frame sheet assembly in accordance with an embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a Quad Flat Non-leaded (QFN) semiconductor package comprising a semiconductor die mounted on a die flag. There is a housing that covers the semiconductor die and the die flag. The housing has a base and sides and there are electrically conductive mounting feet (i.e., leads or lead fingers) that surround the die flag. Each of the mounting feet includes an exposed base surface in the base of the housing, an opposite parallel surface covered by the housing, and an exposed end surface in the one of the sides of the housing. The exposed end surface is normal to, and located between, the exposed base surface and the opposite parallel surface. Bond wires selectively electrically connect electrodes of the semiconductor die to a respective one of the mounting feet and an electrically conductive plating coats the exposed end surface.

In another embodiment, the present invention provides a method of assembling a QFN semiconductor package. The method includes providing a populated housed lead frame sheet assembly of assembled QFN semiconductor packages. Each of the packages is formed from a lead frame comprising a surrounding frame that surrounds a die flag. There are tie bars extending inwardly from the surrounding frame and supporting the die flag. Electrically conductive mounting feet surround the die flag and extend inwardly from the surrounding frame. There is a semiconductor die mounted on the die flag. Bond wires selectively electrically connect electrodes of the semiconductor die to respective ones of the mounting feet. There is a housing having a base and sides. The housing covers the semiconductor die and partially covers the die flag and the mounting feet such that each of the mounting feet includes an exposed base surface in the base of the housing and an opposite parallel surface covered by the housing. After the populated housed lead frame sheet assembly is provided the method performs partially separating each of the packages from each other to provide a partially separated sheet assembly of partially separated packages. The partially separating is performed by removing lengths of the surrounding frame to expose an end surface of each of the electrically conductive mounting feet in the sides of the housing, wherein the exposed end surface is normal to, and located between, the exposed base surface and the opposite parallel surface. The method performs mounting each of the partially separated packages to a respective electroplating mount, the electroplating mount having an electrically insulating body with conductive bars located along peripheral edges of the electrically insulating body. The conductive bars electrically interconnect to the mounting feet that are located along the peripheral edge. The method then performs coating the exposed end surface of each of the mounting feet with an electrically conductive plating.

Referring now to FIG. 1, there is illustrated a top plan view of a populated lead frame sheet assembly 100. The populated lead frame sheet assembly 100 includes an electrically conductive sheet 102 that is typically copper based (coated with a conductive plating for solder joint compatability) that has an array of lead frames 104 formed in the sheet 102. The lead frames 104 are normally formed in the sheet 102 by a cutting or punching process and each of the lead frames 104 includes a surrounding frame 106 that surrounds a respective die flag 108 (lead frame flag).

Tie bars 110 extend inwardly from each surrounding frame 106 and support the die flag 108 associated with the respective frame 106. Each of the lead frames 104 have electrically conductive mounting feet 112 extending inwardly from a respective surrounding frame 106 towards the die flag 108 that is enclosed by the respective surrounding frame 106. Also, a respective semiconductor die 120 is mounted on each die flag 108 and bond wires 122 selectively electrically connect electrodes 124 of each semiconductor die 120 to a respective one of the mounting feet 112. In one embodiment, the lead frames are formed of a conductive metal like copper and are plated with a protective material like Palladium.

Figure 2:
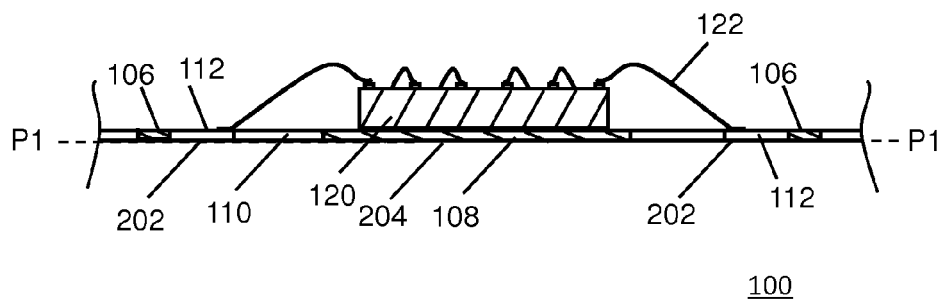
FIG. 2 is a cross-sectional side view, through 2-2', of the populated lead frame sheet assembly of FIG. 1.

Referring to FIG. 2, there is illustrated a cross-sectional side view, through 2-2', of the populated lead frame sheet assembly 100. As shown, underside surfaces 202 of the mounting feet 112 and an underside surface 204 of each die flag 108 are coplanar as indicated by plane P1.

Figure 3:
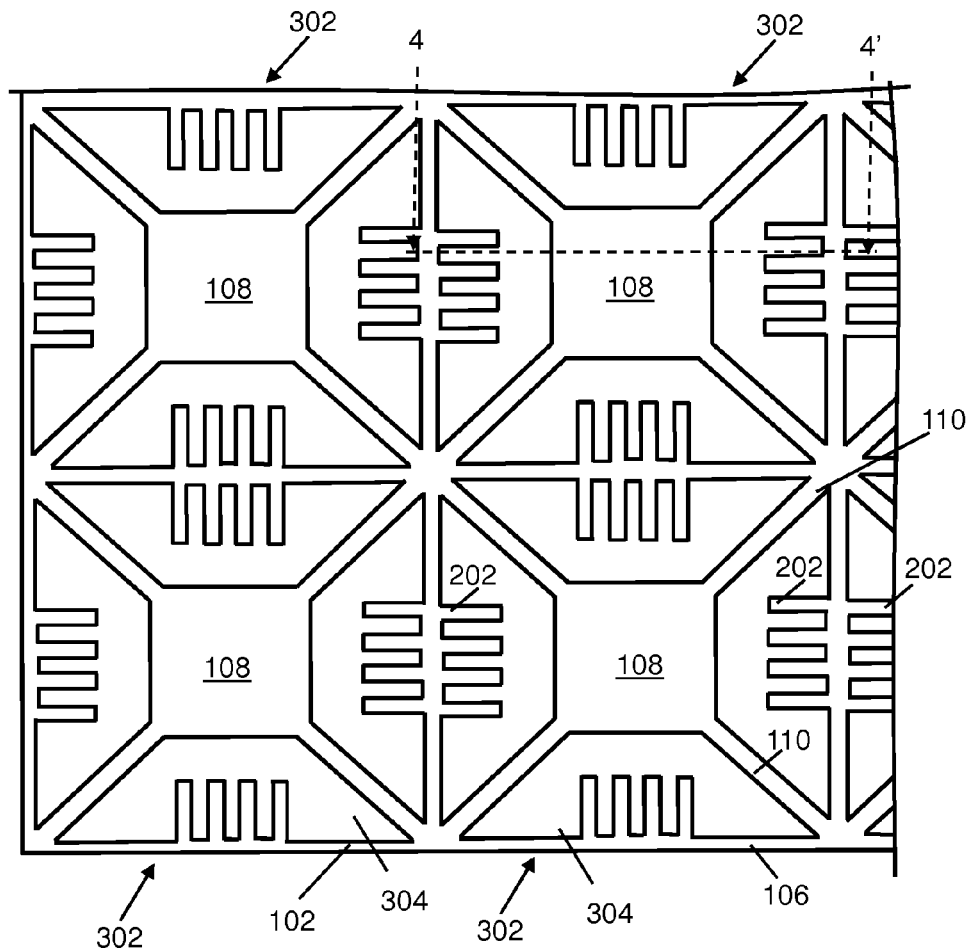
FIG. 3 is an underside plan view of a populated housed lead frame sheet assembly formed from the populated lead frame sheet assembly of FIG. 1.

Referring to FIG. 3 there is illustrated an underside plan view of a populated housed lead frame sheet assembly 300, of assembled Flat Non-leaded semiconductor packages 302, formed from the populated lead frame sheet assembly 100. The populated housed lead frame sheet assembly 300 includes a housing 304, formed from a molding compound, for each one of the assembled Flat Non-leaded semiconductor packages 302, and each housing 302 is typically formed from a molded encapsulating material.

Figure 4:
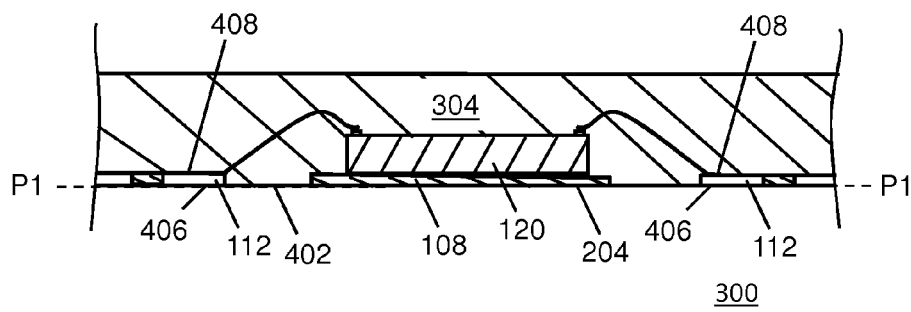
FIG. 4 is a cross-sectional side view, through 4-4' of the populated housed lead frame sheet assembly of FIG. 3.

FIG. 4 illustrates a cross-sectional side view, through 4-4' of the populated housed lead frame sheet assembly 300 formed from the populated lead frame sheet assembly 100. As shown, the housing 304 for every one of the packages 302 has a base 402 and the housing covers respective semiconductor dies 120 and partially covers the mounting feet 112 such that each of the mounting feet 112 includes an exposed base surface 406 (the underside surface 202) in the base 402 of the housing 304 and a opposite parallel surface 408 is covered by the housing 304. The underside surface 204 of the die flag 108 is also exposed in the base 402 of the housing 304, and as previously mentioned the exposed base surface 406 (the underside surface 202) and underside surface 204 are the coplanar underside surfaces as indicated by the plane P1.

Figure 5:
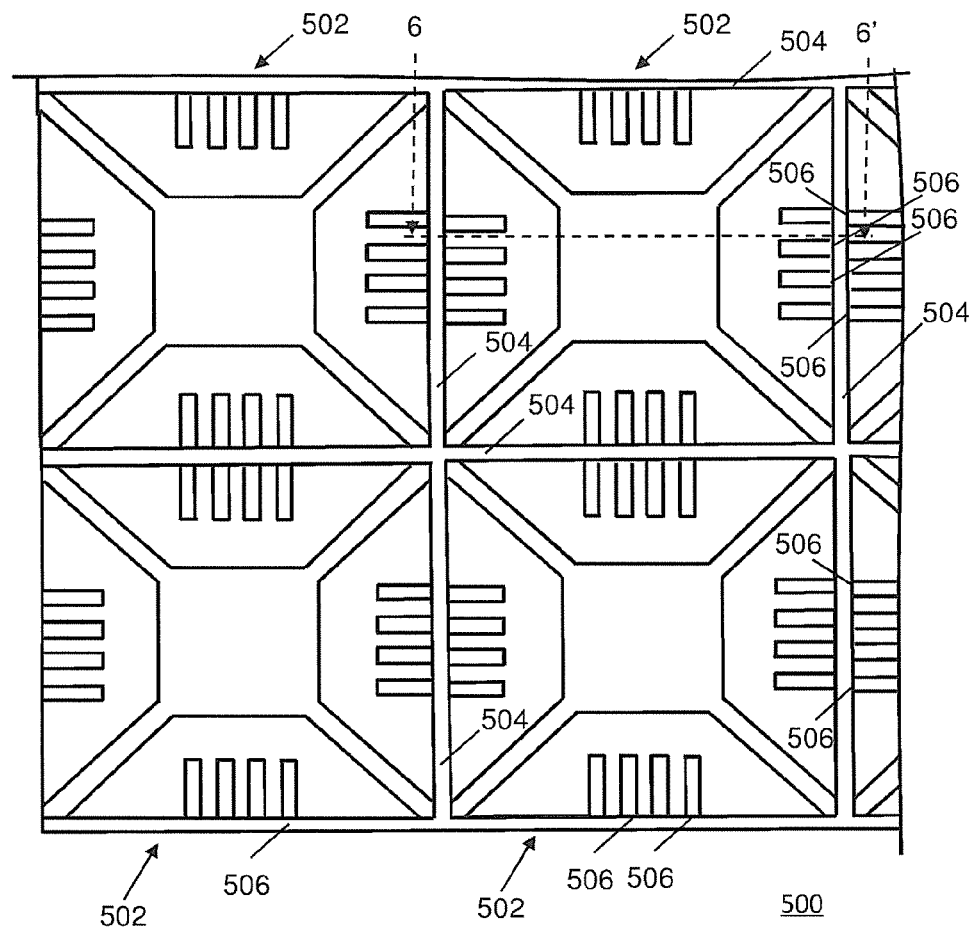
FIG. 5 is an underside plan view of a partially separated sheet assembly formed from the populated housed lead frame sheet assembly of FIG. 3, in accordance with a preferred embodiment of the present invention.

Referring to FIG. 5 there is illustrated an underside plan view of a partially separated sheet assembly 500 formed from the populated housed lead frame sheet assembly 300, in accordance with a preferred embodiment of the present invention. The partially separated sheet assembly 500 comprises partially separated packages 502 formed by removing the surrounding frame 106 to provide gaps 504 (that may form grooves in the housing 302). In this embodiment all lengths of the surrounding frames are removed, however in other embodiment the corner regions of the frames may remain. Each of these gaps 504 expose an end surface 506 of each of the electrically conductive mounting feet 112. Thus, each exposed end surface 506 is normal to, and located between, a respective exposed base surface 406 and the opposite parallel surface 408.

Figure 6:
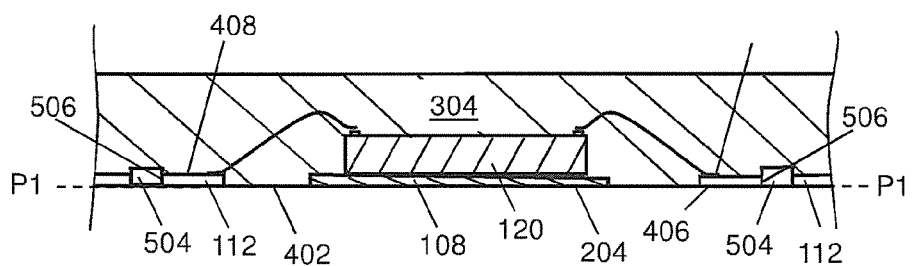
FIG. 6 is a cross-sectional side view, through 6-6', of the partially separated sheet assembly of FIG. 5, in accordance with a preferred embodiment of the present invention.

Referring to FIG. 6 there is illustrated a cross-sectional side view, through 6-6', of the partially separated sheet assembly 500. In this embodiment the gaps 504 extend slightly into the housing 304 to form grooves in the housing 302.

Figure 7:
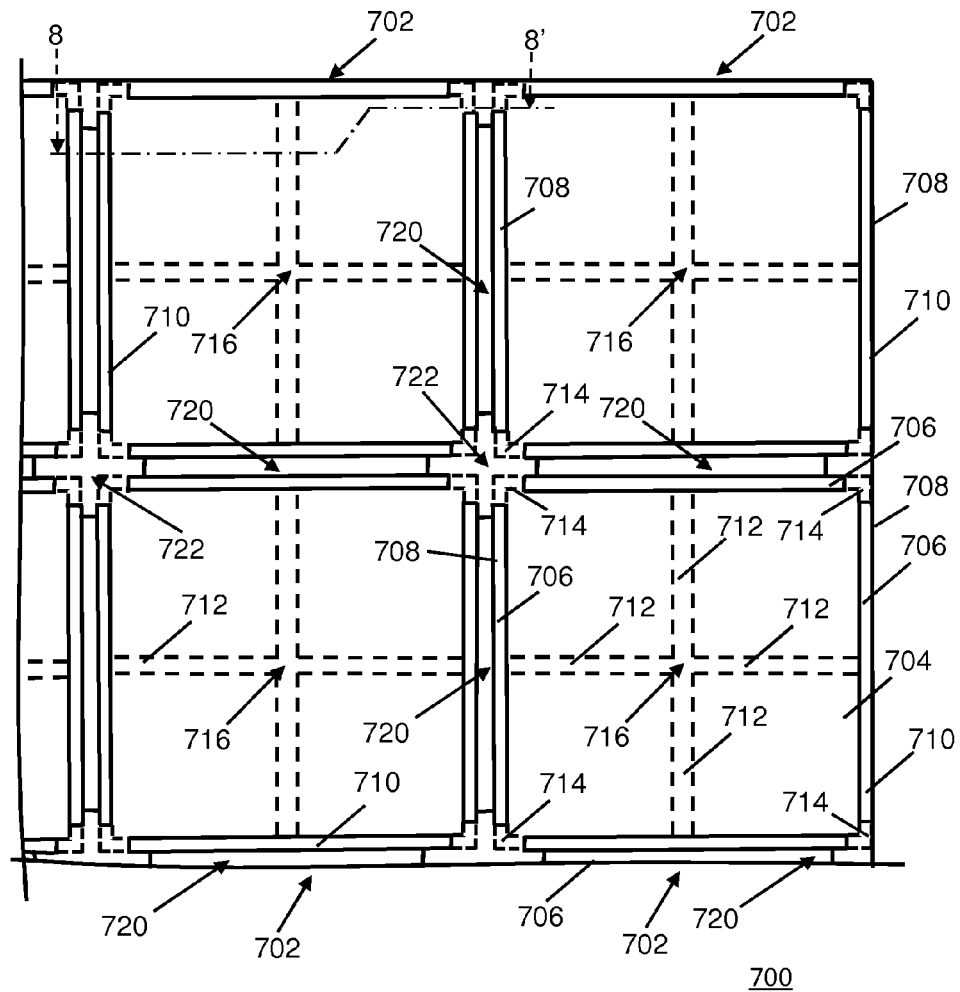
FIG. 7 is a top plan view of a mounting sheet of an array of electroplating mounts, in accordance with a preferred embodiment of the present invention.

Referring to FIG. 7 there is illustrated a top plan view of a mounting sheet 700 of an array of electroplating mounts 702, in accordance with a preferred embodiment of the present invention. The mounting sheet 700 includes an electrically insulating body 704 (typically rubber or plastics based) with conductive bars 706 located along peripheral edges 708 of each of the electroplating mounts 702. Thus, the conductive bars 706 form a peripheral frame 710 for a respective one of the electroplating mounts 702. As shown, each of the electroplating mounts 702 includes interconnecting runners 712 coupling the conductive bars 706 of a respective one of the electroplating mounts 702 together.

Each peripheral frame 710 includes recessed corner regions 714 encased in the body 704 and in this plan view the interconnecting runners 712 form a cross and wherein at least a central intersecting region 716 of the cross is recessed. However, as illustrated in this embodiment all the total lengths of the interconnecting runners 712 are recessed relative to the peripheral frame 710 and are encased in the body 704. Between each of the electroplating mounts 702 are a slots or gaps 720 with elongate surface defining the peripheral edges 708. Also, interconnecting bridges 722, which are part of the body 704, are located at the recessed corner regions 714 and couple adjacent mounts 702 together.

Figure 8:
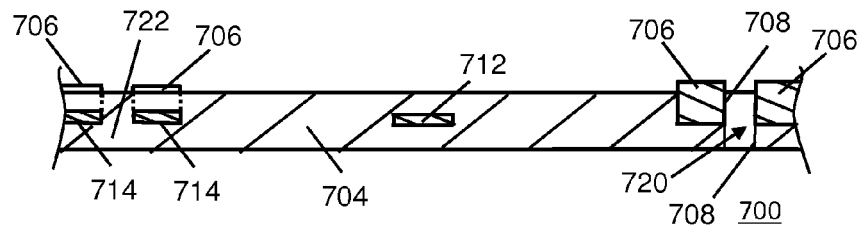
FIG. 8 is a cross-sectional side view through 8-8' of the mounting sheet of FIG. 7.

Referring to FIG. 8 there is illustrated a cross-sectional side view through 8-8' of the mounting sheet 700 showing the recessed corner regions 714 and one of the recessed interconnecting runners 712.

Figure 9:
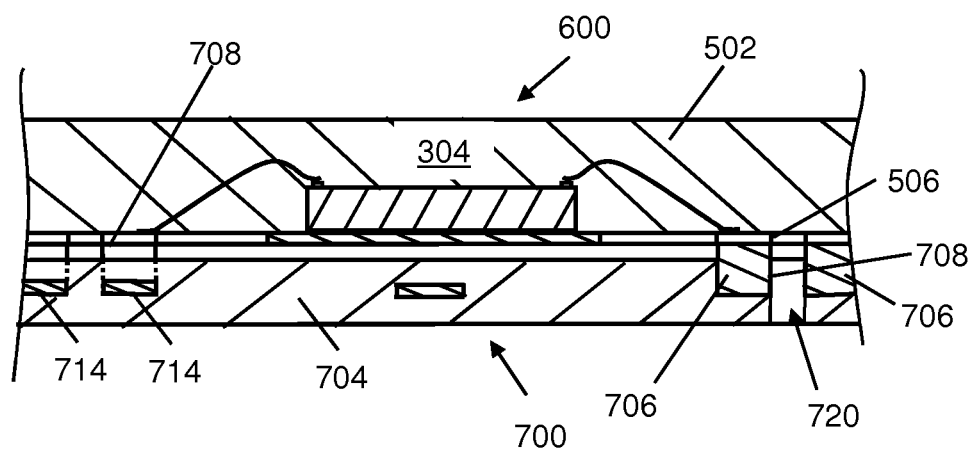
FIG. 9 is a side view of a combined assembly of the partially separated sheet assembly of FIG. 5 mounted to a respective electroplating mount of the mounting sheet of FIG. 7, in accordance with a preferred embodiment of the present invention.

FIG. 9 shows a side view of a combined assembly 900 of the partially separated sheet assembly of 500 (partially separated packages 502) mounted to a respective electroplating mount of the mounting sheet 700, in accordance with a preferred embodiment of the present invention. When so mounted each of the conductive bars 706 are aligned with a peripheral edge of a respective partially separated package 502 and thereby abut and cover the exposed base surface 406 of each of the mounting feet 112 along a respective peripheral edge 708.

Figure 10:
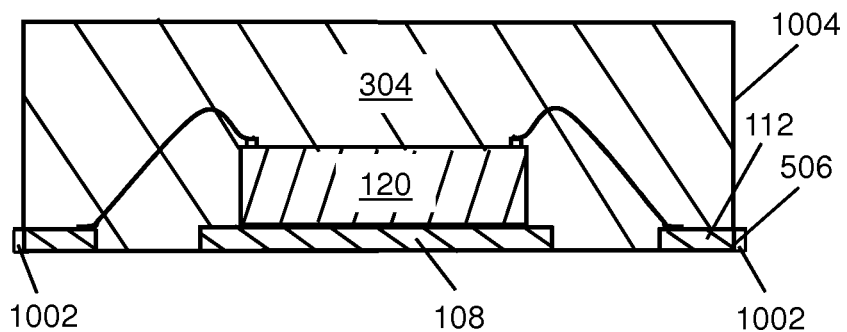
FIG. 10 is a side view of a Quad Flat Non-leaded (QFN) semiconductor package in accordance with a preferred embodiment of the present invention.

Referring to FIG. 10 there is illustrated a side view of a QFN semiconductor package 1000, in accordance with a preferred embodiment of the present invention. The QFN semiconductor package 1000 is formed by performing an Electro-plating process on the combined assembly 900 and then removing the mounting sheet 700 and completely separating the individual packages 502 from each other.

The QFN semiconductor package 1000 comprises the semiconductor die 120 mounted on the die flag 108. The housing 304 covers the semiconductor die 120 and there is an electrically conductive plating 1002 covering the exposed end surface 506 of each of the electrically conductive mounting feet 112. The mounting feet 112 are located adjacent each of the sides 1004 of the housing 304 and thereby the package 1000 is a QFN package with each exposed end surface 506 being parallel to a respective one of the sides 1004 of the housing 304. The electrically conductive plating 1002 is typically a tin based compound, which allows the exposed base surface 406 to form part of a solder joint.

Figure 11:
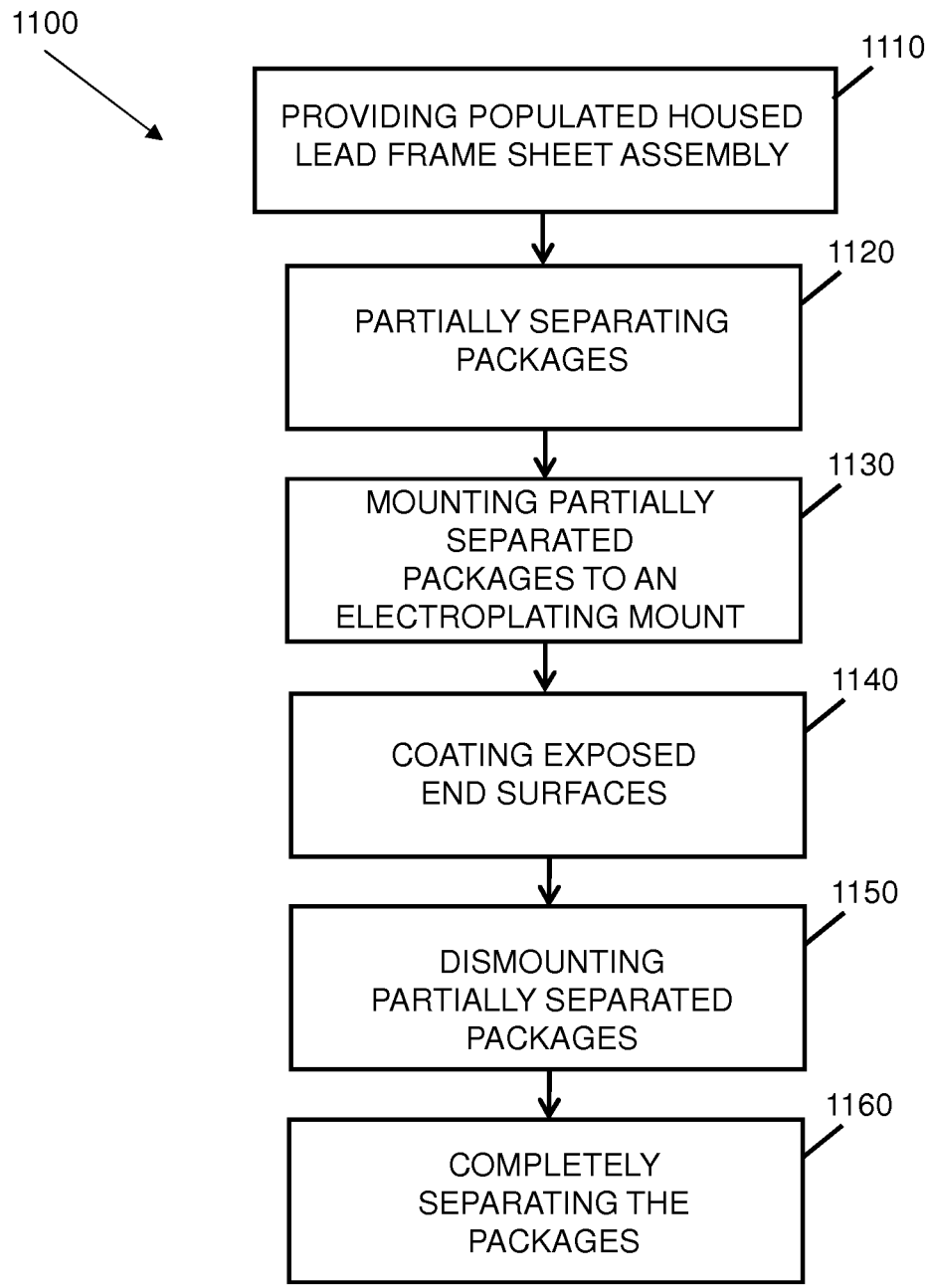
FIG. 11 is a flow chart of a method of assembling a QFN semiconductor package in accordance with a preferred embodiment of the present invention.

Referring to FIG. 11 there is illustrated a flow chart of a method 1100 of manufacturing a Flat Non-leaded semiconductor package, in accordance with a preferred embodiment of the present invention. The method 1100, at block 1110, starts by providing the populated housed lead frame sheet assembly 300 of assembled QFN semiconductor packages 302. At block 1120 there is performed partially separating each of the packages 302 from each other to provide the partially separated sheet assembly 500 of partially separated packages 502. The method 1100 then, at block 1130, performs mounting each of the partially separated packages 502 to the respective electroplating mount 702 of the mounting sheet 700.

At block 1140 there is performed a process of coating the exposed end surfaces 506 of each of the mounting feet 112 with the electrically conductive plating 1002. The coating is performed by an electroplating process in which one of the coating electrodes is coupled to the conductive bars 706 which are electrically coupled to the mounting feet 112. Thus, these electrical connections facilities the coating of the exposed end surfaces 506 as current is passed through the conductive bars 706 and to the mounting feet 112 during the electroplating process.

At dismounting block 1150, there is performed a process of dismounting the partially separated packages 502 from their respective electroplating mount 702. The method 1100 then at a block 1160 performs completely separating each of the packages from each other, by a sawing or cutting process of the housing 304, to provide the QFN semiconductor packages 1000.

Advantageously, the present invention provides for coating the exposed end surfaces 506 thereby providing a suitable additional solder joint surface for the mounting feet 112. This therefore improves the quality of the solder joint connections of the mounting feet 112 and mounting pads of a circuit board.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of assembling a Quad Flat Non-leaded (QFN) semiconductor package, the method comprising:
   providing a populated housed lead frame sheet assembly of assembled QFN semiconductor packages, wherein each of the packages is formed from a lead frame comprising a surrounding frame that surrounds a die flag, tie bars extending inwardly from the surrounding frame and support the die flag and electrically conductive feet extending inwardly from the surrounding frame, and wherein a semiconductor die mounted on the die flag, bond wires selectively electrically connecting electrodes of the semiconductor die to respective ones of the feet, and a housing having a base and sides, the housing covering the semiconductor die, the flag, and partially covering the feet such that each of the feet includes an exposed base surface in the base of the housing and an opposite parallel surface covered by the housing;
   partially separating each of the packages from each other to provide a partially separated sheet assembly of partially separated packages, the partially separating being performed by removing lengths of the surrounding frame to expose an end surface of each of the electrically conductive feet in the sides of the housing, wherein the exposed end surface is normal to, and located between, the exposed base surface and the opposite parallel surface;
   mounting each of the partially separated packages to a respective electroplating mount, the electroplating mount having an electrically insulating body with conductive bars located along peripheral edges of the insulating body, and wherein the conductive bars electrically interconnect to the mounting feet that are located along the peripheral edge; and
   plating the exposed end surface of each of the feet with an electrically conductive plating.

2. The method of claim 1, wherein the plating comprises an electroplating process.

3. The method of claim 2, wherein current is passed through the conductive bars during the electroplating process.

4. The method of claim 1, wherein the electroplating mount includes interconnecting runners coupling the conductive bars together.

5. The method of claim 1, wherein the conductive bars form a peripheral frame.

6. The method of claim 5, wherein the peripheral frame includes recessed corner regions.

7. The method of claim 6, wherein the recessed corner regions are encased in the electrically insulating body of the electroplating mount.

8. The method of claim 6, wherein the exposed base portion is parallel to the base of the housing.

9. The method of claim 5, wherein the interconnecting runners in plan view form a cross and wherein a central intersecting region of the cross is recessed.

10. The method of claim 9, wherein the interconnecting runners are encased in the electrically insulating body of the electroplating mount.

11. The method of claim 1, further comprising dismounting the partially separated packages from their respective electroplating mount.

12. The method of claim 11, further comprising completely separating each of the packages from each other to provide QFN semiconductor packages.

13. The method of claim 12, wherein the completely separating each of the packages comprises sawing or cutting the housing.

14. The method of claim 1, wherein the lead frame comprises Palladium coated Copper and the electrically conductive plating material comprises Tin.

* * * * *